(12) United States Patent
Lee et al.

(10) Patent No.: US 11,398,416 B2
(45) Date of Patent: Jul. 26, 2022

(54) PACKAGE STRUCTURE AND METHOD OF FABRICATING THE SAME

(71) Applicant: Taiwan Semiconductor Manufacturing Co., Ltd., Hsinchu (TW)

(72) Inventors: Tzung-Hui Lee, New Taipei (TW); Hung-Jui Kuo, Hsinchu (TW); Ming-Che Ho, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 80 days.

(21) Appl. No.: 16/698,973

(22) Filed: Nov. 28, 2019

(65) Prior Publication Data
US 2021/0090973 A1    Mar. 25, 2021

Related U.S. Application Data

(60) Provisional application No. 62/904,698, filed on Sep. 24, 2019.

(51) Int. Cl.
| | | |
|---|---|---|
| *H01L 23/48* | (2006.01) | |
| *H01L 23/31* | (2006.01) | |
| *H01L 23/00* | (2006.01) | |
| *H01L 23/498* | (2006.01) | |
| *H01L 21/48* | (2006.01) | |
| *H01L 21/56* | (2006.01) | |

(52) U.S. Cl.
CPC ........ *H01L 23/481* (2013.01); *H01L 21/4853* (2013.01); *H01L 21/4857* (2013.01); *H01L 21/568* (2013.01); *H01L 23/3107* (2013.01); *H01L 23/49816* (2013.01); *H01L 23/49822* (2013.01); *H01L 24/16* (2013.01); *H01L 2224/16235* (2013.01)

(58) Field of Classification Search
CPC ............... H01L 23/481; H01L 21/4853; H01L 21/4857
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2014/0252646 A1* | 9/2014 | Hung ...................... H01L 24/81 257/774 |
| 2020/0328144 A1* | 10/2020 | Fan .......................... H01L 21/56 |
| 2020/0411445 A1* | 12/2020 | Chen .................... H01L 21/4853 |

* cited by examiner

*Primary Examiner* — Errol V Fernandes
(74) *Attorney, Agent, or Firm* — JCIPRNET

(57) ABSTRACT

A structure including a semiconductor die, a conductive pillar, and an insulating encapsulation is provided. The conductive pillar includes a first pillar portion and a second pillar portion disposed on the first pillar portion, wherein a first width of the first pillar portion is greater than a second width of the second pillar portion. The insulating encapsulation laterally encapsulates the semiconductor die and the conductive pillar.

20 Claims, 15 Drawing Sheets

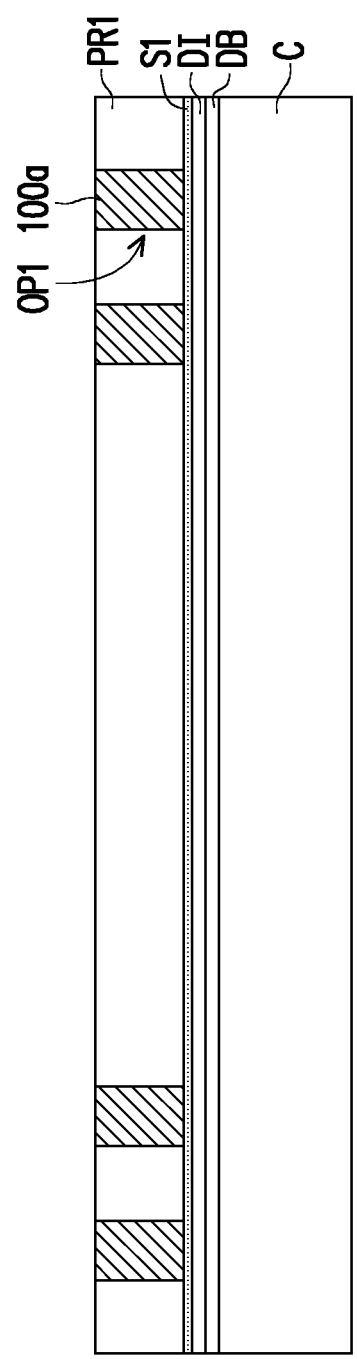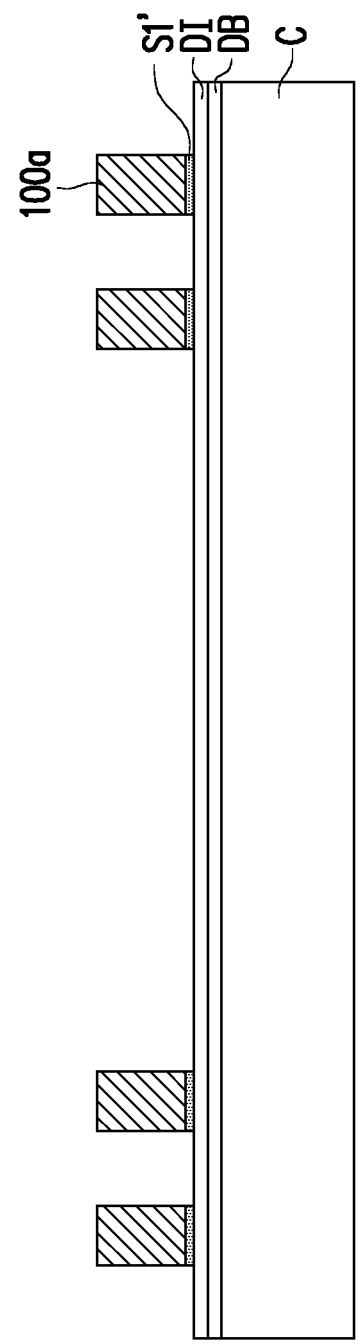
FIG. 2A
FIG. 2B

PACKAGE STRUCTURE AND METHOD OF FABRICATING THE SAME

CROSS-REFERENCE TO RELATED APPLICATION

This application claims the priority benefit of U.S. provisional application Ser. No. 62/904,698, filed on Sep. 24, 2019. The entirety of the above-mentioned patent applications is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies. Currently, integrated fan-out packages are becoming increasingly popular for their compactness. However, there are challenges related to integrated fan-out packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A through FIG. 2H are cross-sectional views schematically illustrating a process flow for fabricating a package structure in accordance with some alternative embodiments of the present disclosure.

DETAILED DESCRIPTION

Figure 1A:
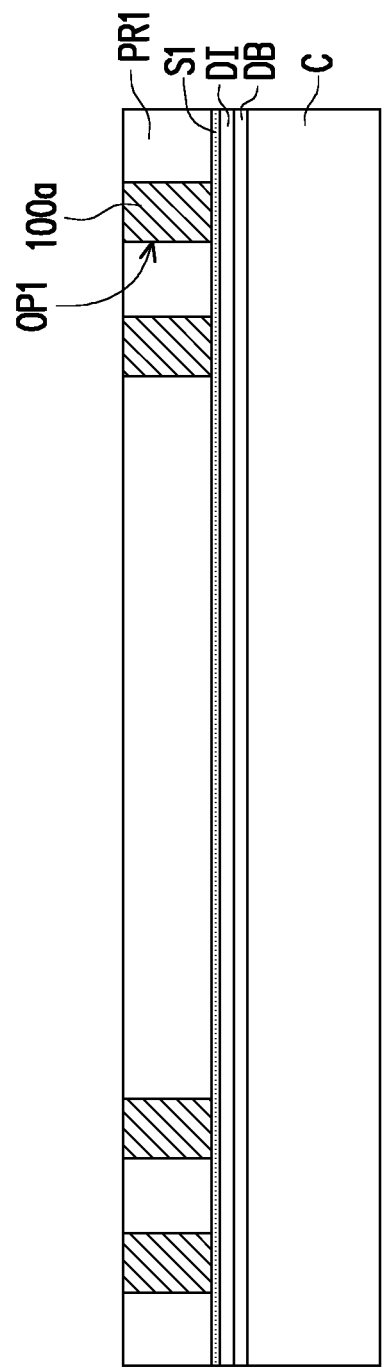
FIG. 1A through FIG. 1H are cross-sectional views schematically illustrating a process flow for fabricating a package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1H are cross-sectional views schematically illustrating a process flow for fabricating a package structure in accordance with some embodiments of the present disclosure.

Referring to FIG. 1A, a carrier C having a de-bonding layer DB and a dielectric layer DI formed thereon is provided, wherein the de-bonding layer DB and the dielectric layer DI are stacked over the carrier C. In other words, the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB. However, the materials of the carrier C, the de-bonding layer DB and the dielectric layer DI are not limited in the invention. In some alternative embodiments, the dielectric layer DI formed on the carrier C may be omitted; in other words, merely the de-bonding layer DB is formed over the carrier C. The de-bonding layer DB allows the structure formed over the carrier C in the subsequent processes to be peeled off from the carrier C.

In some embodiments where the de-bonding layer DB and the dielectric layer DI are formed over the carrier C, a seed layer S1 is entirely formed over the dielectric layer DI through a sputtering process after the dielectric layer DI is formed over the de-bonding layer DB carried by the carrier C. In some alternative embodiments where the fabrication of the dielectric layer DI is omitted, a seed layer is formed over the de-bonding layer DB directly through a sputtering process. For example, the seed layer S1 is a sputtered Ti/Cu layer formed on the dielectric layer DI or the de-bonding layer DB. Then, a first patterned photoresist layer PR1 is formed on the seed layer S1 through spin-coating, baking, photolithography, and development processes, for example. The first patterned photoresist layer PR1 may be formed to include first openings OP1 such that portions of the seed layer S1 are exposed by the first openings OP1 defined in the first patterned photoresist layer PR1. The carrier C including the first patterned photoresist layer PR1 formed thereon may be immersed into a plating solution contained in a plating bath such that first pillar portions 100a are plated in the first openings OP1 defined in the first patterned photoresist layer PR1. By using the first patterned photoresist layer PR1 as a plating mask, conductive material may be selectively plated on the portions of the seed layer S1 exposed by the first openings OP1 to form the first pillar portions 100a. As illustrated in FIG. 1A, the height of the first pillar portions 100a may be equal to the thickness of the first patterned photoresist layer PR1. In some other embodiments, the height of the first pillar portions 100a is slightly less than or slightly greater than the thickness of the first patterned photoresist layer PR1. The height of the first pillar portions 100a is determined by the thickness of the first patterned photoresist layer PR1, and the width of the first pillar portions 100a is determined by the lateral dimension of the first openings OP1 defined in the first patterned photoresist layer PR1. In some embodiments, the material of the first pillar portions 100a includes copper or other suitable metallic materials.

After the first pillar portions 100a are formed on the seed layer S1, a second patterned photoresist layer PR2 is formed on the first patterned photoresist layer PR1 to partially cover the top surfaces of the first pillar portions 100a. The second patterned photoresist layer PR2 is formed through spin-coating, baking, photolithography, and development processes, for example. The second patterned photoresist layer PR2 may include second openings OP2 for exposing portions of the top surfaces of the first pillar portions 100a. The second openings OP2 defined in the second patterned photoresist layer PR2 are located above and substantially aligned with the first pillar portions 100a. In other words, the second openings OP2 defined in the second patterned photoresist layer PR2 are substantially aligned with the first openings OP1 defined the first patterned photoresist layer PR1. In some embodiments, the first openings OP1 defined in the first patterned photoresist layer PR1 are wider than the second openings OP2 defined in the second patterned photoresist layer PR2.

Figure 1B:
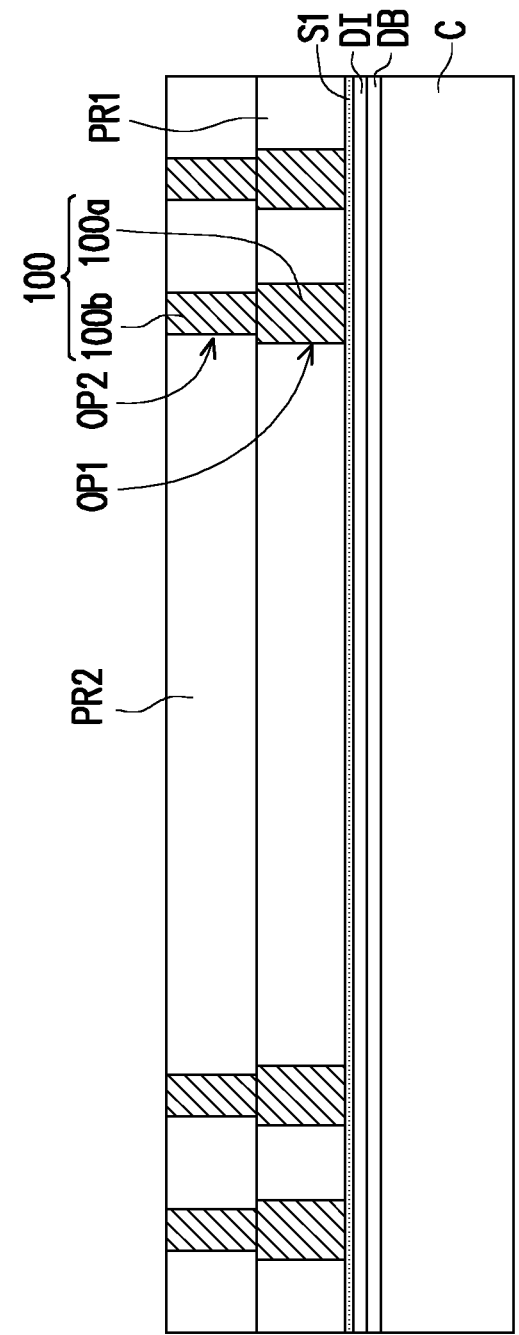

The carrier C including the first patterned photoresist layer PR1, the first pillar portions 100a, and the second patterned photoresist layer PR2 formed thereon may be immersed into a plating solution contained in a plating bath such that second pillar portions 100b are plated in the second openings OP2 defined in the second patterned photoresist layer PR2. The second pillar portions 100b are plated and landed on the top surfaces of the first pillar portions 100a such that conductive pillars 100 including the first pillar portions 100a and the second pillar portions 100b are formed. As illustrated in FIG. 1B, the height of the second pillar portions 100b may be equal to the thickness of the second patterned photoresist layer PR2. In some other embodiments, the height of the second pillar portions 100b is slightly greater than or slightly less than the thickness of the second patterned photoresist layer PR2. The height of the second pillar portions 100b is determined by the thickness of the second patterned photoresist layer PR2, and the width of the second pillar portion 100b is determined by the lateral dimension of the second openings OP2 defined in the second patterned photoresist layer PR2. In some embodiments, the material of the second pillar portions 100b includes copper or other suitable metallic materials.

Since the second pillar portions 100b are plated on the top surfaces of the first pillar portions 100a, there is no seed pattern formed between the first pillar portions 100a and the second pillar portions 100b.

As illustrated in FIG. 1B, the thickness of the first patterned photoresist layer PR1 is substantially equal to the thickness of the second patterned photoresist layer PR2. In some other embodiments, the thickness of the first patterned photoresist layer PR1 is slightly different from the thickness of the second patterned photoresist layer PR2. Each of the second pillar portions 100b may be substantially aligned with one of the first pillar portions 100a, respectively. In some embodiments, the first pillar portions 100a and the second pillar portions 100b may be cylindrical pillars, and each one of the second pillar portions 100b is concentrically stacked on one of the first pillar portions 100a, respectively.

Figure 1C:
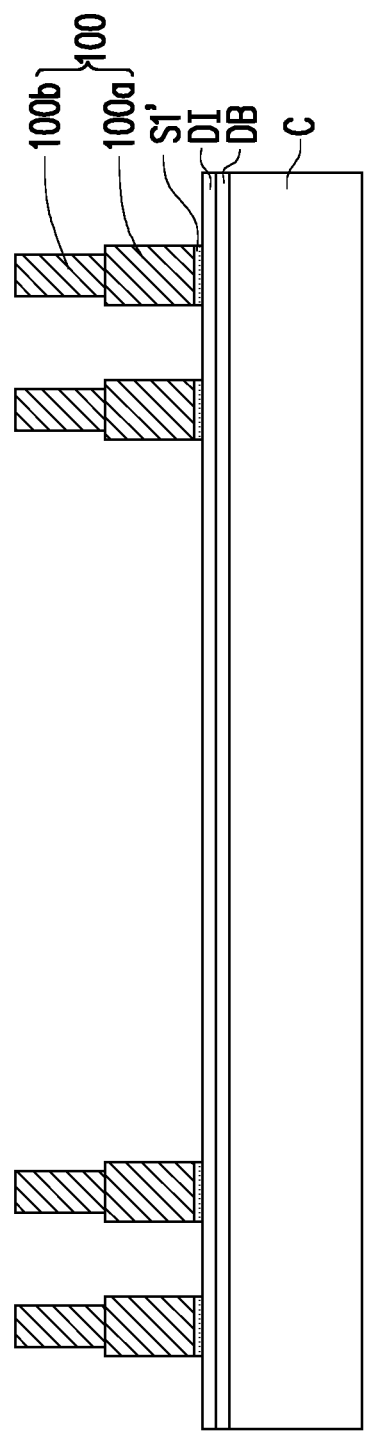

Referring to FIG. 1B and FIG. 1C, after the first pillar portions 100a and the second pillar portions 100b are formed, the first patterned photoresist layer PR1 and the second patterned photoresist layer PR2 are removed such that portions of the seed layer S1 that are not covered by the first pillar portions 100a are revealed. In some embodiments, the first patterned photoresist layer PR1 and the second patterned photoresist layer PR2 are removed through a stripping process simultaneously.

In some embodiments, the conductive pillars 100 each including the first pillar portion 100a and the second pillar portion 100b may be formed through a two-step plating process as illustrated in FIG. 1A and FIG. 1B. In other words, the process for forming the conductive pillars 100 is a two-step plating process as illustrated in FIG. 1A and FIG. 1B. In some alternative embodiments, each of the conductive pillars 100 may include more than two stacked pillar portions (e.g., three or more stacked pillar portions), and the stacked pillar portions may be formed through a multiple-step plating process. Take a three-step plating process as an example, first pillar portions are selectively plated on the seed layer by using a first patterned photoresist layer as a plating mask; second pillar portions are selectively plated on top surfaces of the first pillar portions by using a second patterned photoresist layer as a plating mask; and third pillar portions are selectively plated on top surfaces of the second pillar portions by using a third patterned photoresist layer as a plating mask. Then, the first, second and third patterned photoresist layers are removed through a stripping process simultaneously.

Referring to FIG. 1C, by using the conductive pillar 100 including the first pillar portions 100a and the second pillar portions 100b as an etch mask, the portions of the seed layer S1 that are not covered by the first pillar portions 100a are removed through, for example, an etching process until the dielectric layer DI is revealed. After the portions of the seed layer S1 that are not covered by the first pillar portions 100a are removed, seed patterns S1' are formed between the first pillar portions 100a and the dielectric layer DI, and the seed patterns S1' are in contact with the dielectric layer DI.

In some other embodiments where the fabrication of the dielectric layer DI is omitted, by using the conductive pillar 100 including the first pillar portions 100a and the second pillar portions 100b as an etch mask, the portions of the seed layer S1 that are not covered by the first pillar portions 100a may be removed through an etching process until the de-bonding layer DB is revealed. After the portions of the seed layer S1 that are not covered by the first pillar portions 100a are removed, seed patterns S1' are formed between the first pillar portions 100a and the de-bonding layer DB, and the seed patterns S1' are in contact with the de-bonding layer DB.

Since the conductive pillars 100 are formed through a multiple-step plating process, the conductive pillars 100 with high aspect ratio (e.g., aspect ratio higher than 5) may be fabricated easily. Accordingly, the fabrication yield rate of the conductive pillars 100 may increase.

Figure 1D:
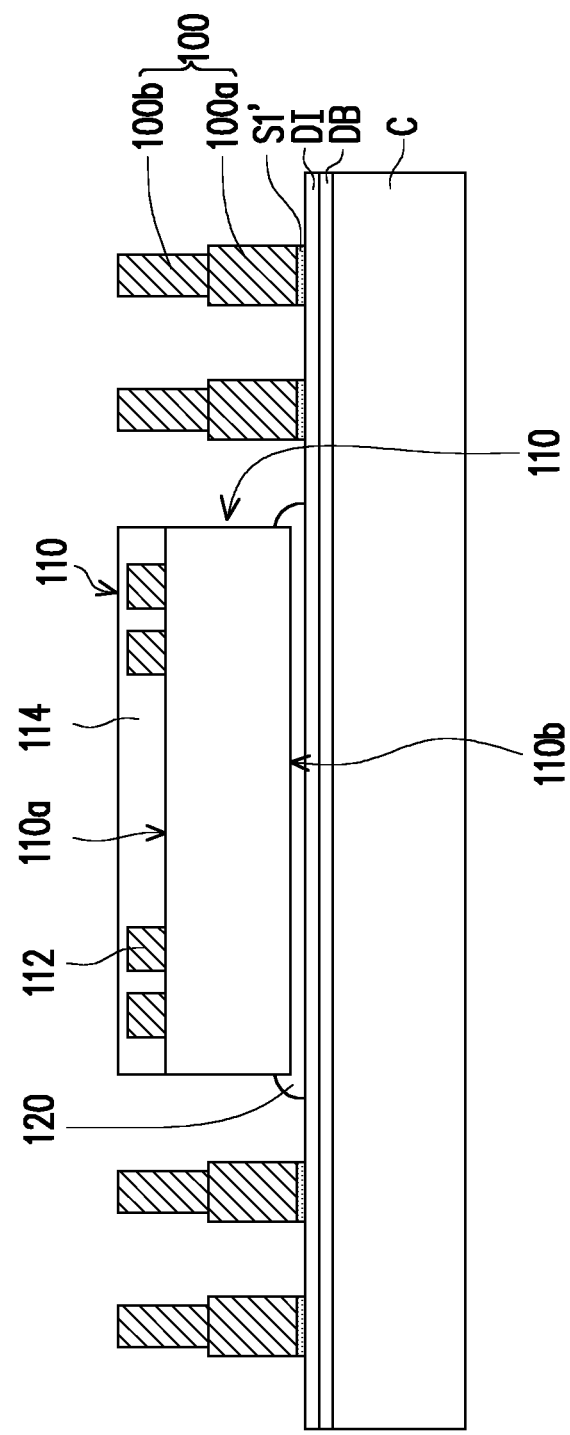

Referring to FIG. 1D, at least one semiconductor die 110 is picked-up and placed over the carrier C such that the semiconductor die 110 is mounted onto the dielectric layer DI through a die attachment film (DAF) 120, an adhesive or the like. The number of the semiconductor die 110 is not limited in the present application. In some embodiments, the semiconductor die 110 includes a back surface 110b and an active surface 110a opposite to the back surface 110b, wherein the back surface 110b of the semiconductor die 110 is adhered to the top surface of the dielectric layer DI through the die attachment film 120. The semiconductor die 110 may further include conductive vias 112 and a dielectric cap 114, wherein the conductive vias 112 protrude from the active surface 110a, and the dielectric cap 114 covers the conductive vias 112 and the active surface 110a of the semiconductor die 110. The conductive vias 112 and the active surface 110a of the semiconductor die 110 are covered and well protected by the dielectric cap 114 when the semiconductor die 110 is picked-up and placed over the carrier C.

As illustrated in FIG. 1D, the level height of the top surface of the dielectric cap 114 is higher than the level height of the top surfaces of the conductive vias 112 and the level height of the top surfaces of the second pillar portions 100b, and the top surfaces of the conductive vias 112 is substantially leveled with the top surfaces of the second pillar portions 100b. In some other embodiments, the level height of the top surface of the dielectric cap 114 may be higher than the level height of the top surfaces of the conductive vias 112 and the level height of the top surfaces of the second pillar portions 100b, and the level height of the top surfaces of the conductive vias 112 may be slightly lower than the level height of the top surfaces of the second pillar portions 100b. In other words, the level height of the top surfaces of the second pillar portions 100b may be between the level height of the top surfaces of the conductive vias 112 and the level height of the top surface of the dielectric cap 114. In still other embodiments, the level height of the top surface of the dielectric cap 114 may be higher than the level height of the top surfaces of the conductive vias 112 and the level height of the top surfaces of the second pillar portions 100b, the level height of the top surfaces of the conductive vias 112 may be slightly higher than the level height of the top surfaces of the second pillar portions 100b, and the level height of the top surfaces of the second pillar portions 100b is higher than the level height of the active surface 110a of the semiconductor die 110. In other words, the level height of the top surfaces of the conductive vias 112 may be between the level height of the top surface of the dielectric cap 114 and the level height of the top surfaces of the second pillar portions 100b.

For instance, the level height of the top surface of the first pillar portions 100a is lower than the level height of the active surface 110a of the semiconductor die 110, and the level height of the top surface of the first pillar portions 100a is higher than the level height of the back surface 110b of the semiconductor die 110.

Figure 1E:
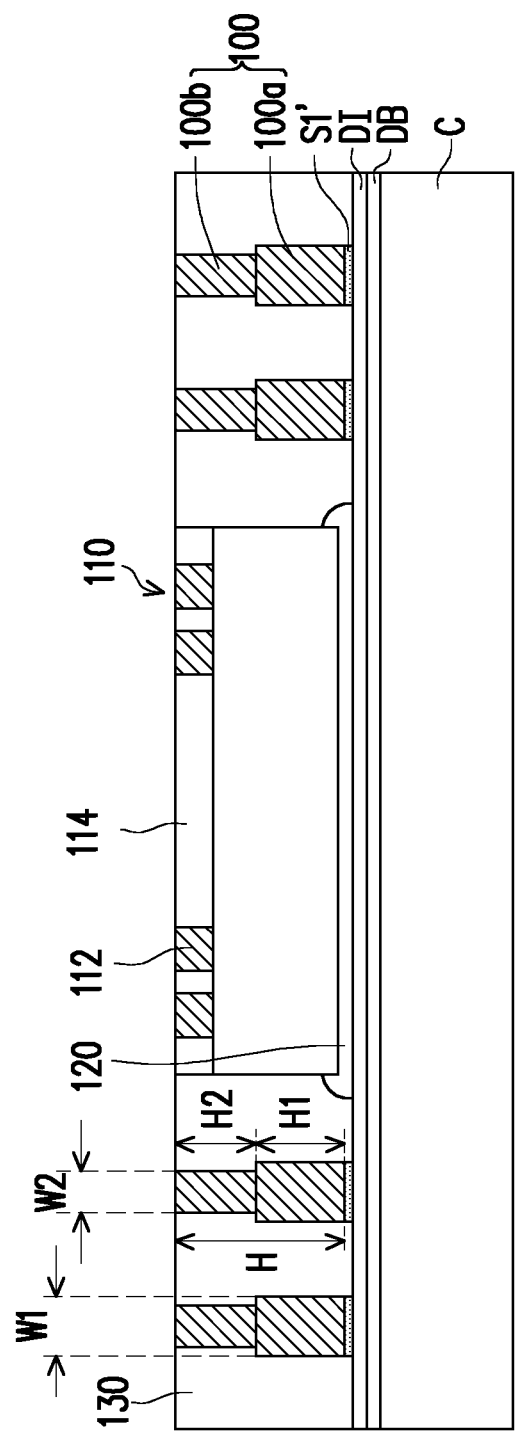

Referring to FIG. 1E, an insulating encapsulation 130 is formed over the carrier C to laterally encapsulate the semiconductor die 110, the seed patterns S1', and the conductive pillars 100. The top surfaces of the semiconductor die 110 and the conductive pillars 100 are accessible exposed from the insulating encapsulation 130. The top surface of the insulating encapsulation 130 may be substantially leveled with the top surfaces of the conductive vias 112, the dielectric cap 114, and the second pillar portions 100b.

The insulating encapsulation 130 may be formed by an over-molding processes followed by a grinding process (e.g., a chemical mechanical polishing (CMP) process and/or a mechanical polishing process). In some embodiments, an insulating material is formed over the carrier C to cover the conductive pillars 100, the semiconductor die 110, the seed patterns S1', and the die attachment film 120, and the insulating material is polished through the above-mentioned grinding process until the top surfaces of the semiconductor die 110 and the conductive pillars 100 are exposed. During the grinding process of the insulating material, a portion of the dielectric cap 114 of the semiconductor die 110 may be removed to expose the top surfaces of the conductive vias 112.

After performing the grinding process of the insulating material, the height H2 of the second pillar portions 100b may be reduced slightly. As illustrated in FIG. 1E, the height H1 of the first pillar portions 100a is substantially equal to the height H2 of the second pillar portions 100b, and the width W1 of the first pillar portions 100a are greater than the width W2 of the second pillar portions 100b. The height H1 of the first pillar portion 100a and the height of the second pillar portion 100b are less than the thickness of the semiconductor die 110. The first pillar portions 100a may each include a vertical side surface in contact with the insulating encapsulation 130. In other words, the top width of the first pillar portion 100a may be substantially equal to the bottom width of the first pillar portion 100a. Furthermore, the second pillar portions 100b may each include a vertical side surface in contact with the insulating encapsulation 130. In other words, the top width of the second pillar portion 100b may be substantially equal to the bottom width of the second pillar portion 100b.

In some embodiments, the aspect ratio (i.e. H1/W1) of the first pillar portions 100a is less than the aspect ratio (i.e. H2/W2) of the second pillar portions 100b, wherein the width W1 of the first pillar portion 100a is greater than the width W2 of the second pillar portion 100b, and the height H1 of the first pillar portion 100a is substantially equal to the height H2 of the second pillar portion 100b. The aspect ratio (i.e. H1/W1) of the first pillar portions 100a may range from about 2.5 to about 2.5n, and n is a positive integer greater than 1, the aspect ratio (i.e. H2/W2) of the second pillar portions 100b may range from about 7 to about 7n, and n is a positive integer greater than 1. For example, the width W1 of the first pillar portions 100a ranges from about 20 micrometers to about 50 micrometers, the height H1 of the first pillar portions 100a ranges from about 50 micrometers to about 80 micrometers, the width W2 of the second pillar portions 100b ranges from about 15 micrometers to about 40 micrometers, and the height H2 of the second pillar portions 100b ranges from about 50 micrometers to about 80 micrometers.

Furthermore, the ratio (i.e. H/W1) of the height of each conductive pillar 100 (i.e. the total height H of the first pillar portion 100a and the second pillar portion 100b of each conductive pillar 100) to the bottom width W1 of each conductive pillar 100 (i.e. the bottom width W1 of the first pillar portions 100a) may range from about 5 to about 5n, and n is a positive integer greater than 1. For example, the bottom width W1 of each conductive pillar 100 ranges from about 20 micrometers to about 50 micrometers, and the height H of each conductive pillar 100 ranges from about 100 micrometers to about 160 micrometers.

Figure 1F:
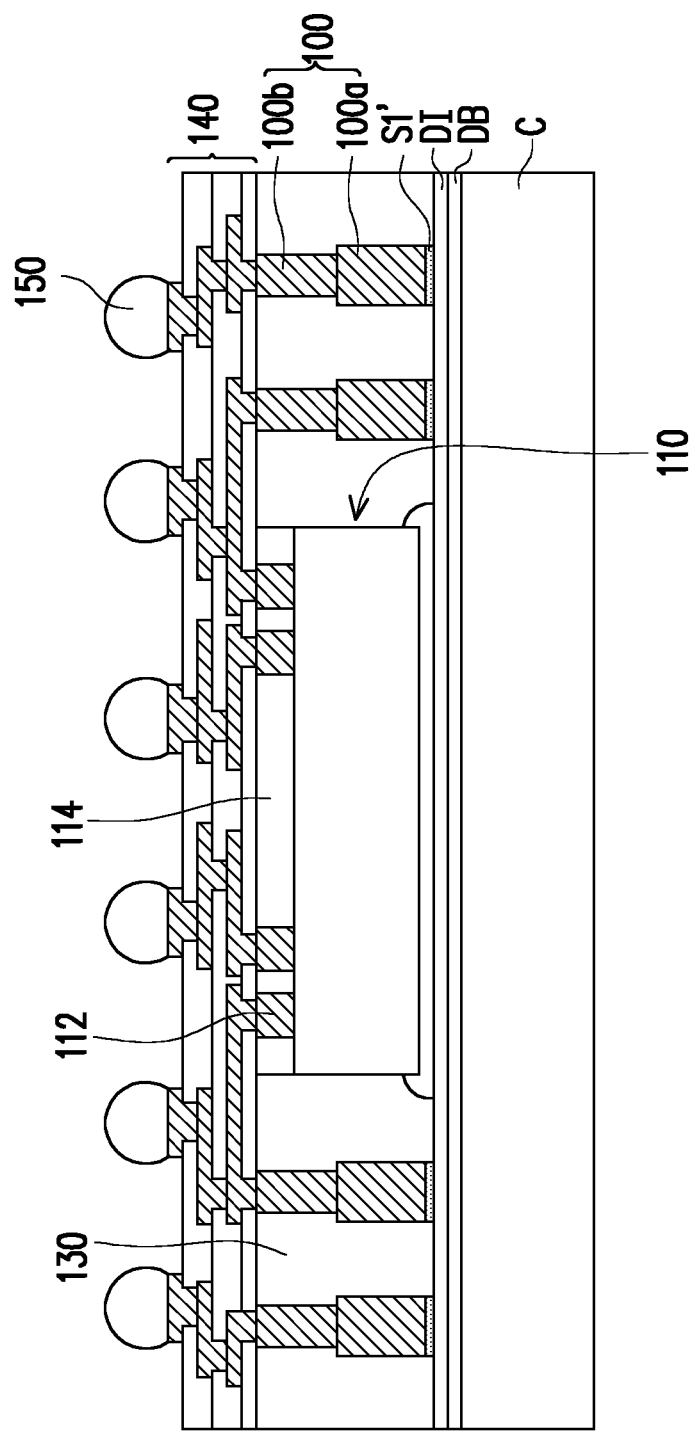

Referring to FIG. 1F, a redistribution circuit layer 140 is formed over the conductive pillars 100, the semiconductor die 110, and the insulating encapsulation 130. In some embodiments, the redistribution circuit layer 140 may include redistribution wiring layers and dielectric layers stacked alternately, wherein the redistribution wiring layers are electrically connected to the conductive pillars 100 and the conductive vias 112 of the semiconductor die 110. In other words, the conductive pillars 100 are may be electrically connected to the semiconductor die 110 through the redistribution wiring layers of the redistribution circuit layer 140. After the redistribution circuit layer 140 is formed, conductive terminals 150 may be formed over the redistribution circuit layer 140, wherein the conductive terminals 150 may be electrically connected to the redistribution wiring layers of the redistribution circuit layer 140. In some embodiments, the conductive terminals 150 may be solder balls formed by a ball placement process or other suitable metallic terminals.

Figure 1G:
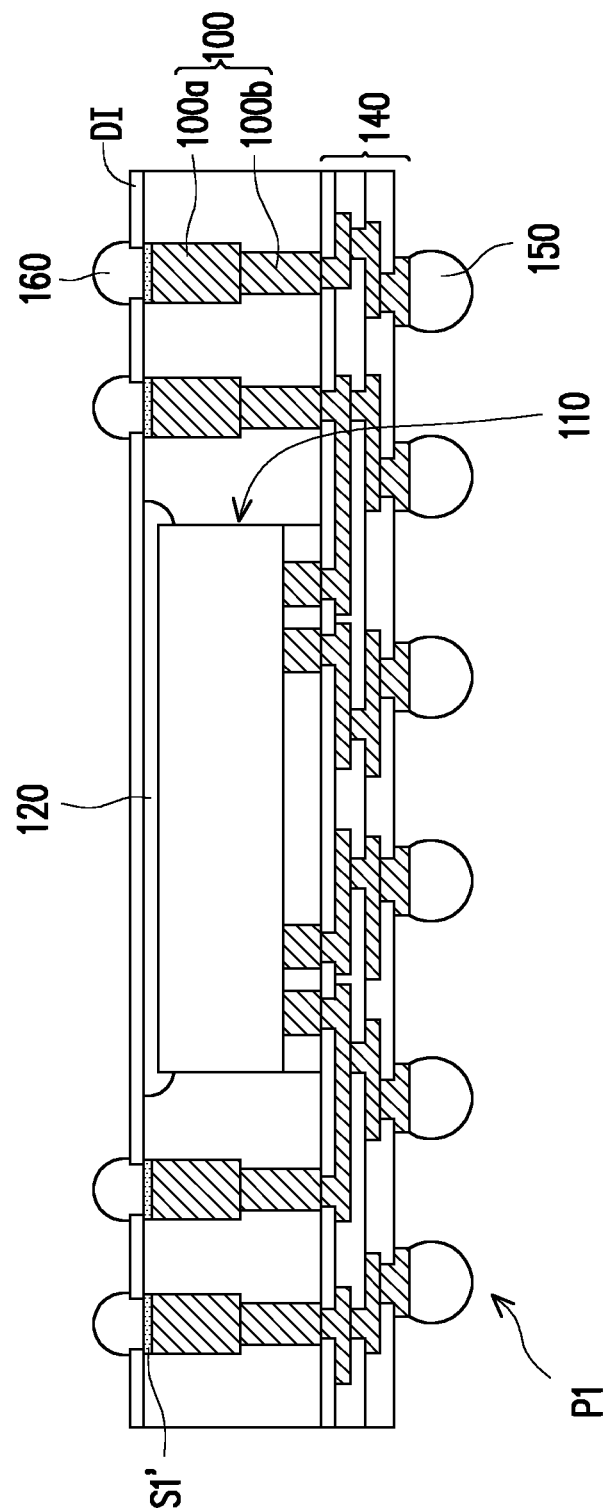

Referring to FIG. 1G, after the redistribution circuit layer 140 and the conductive terminals 150 are formed, the resulted structure formed over the de-bonding layer DB is de-bonded from the de-bonding layer DB such that the de-bonding layer DB and the carrier C may be removed from the resulted structure. After the de-bonding process is performed, a frame mounting process may be performed to flip the resulted structure upside down and mount onto a frame (not illustrated in FIG. 1G) such that a surface of the dielectric layer DI is exposed. Then, a patterning process is performed to form openings in the dielectric layer DI for exposing portions of the seed patterns S1'. In some embodiments, the dielectric layer DI may be patterned through a photolithography process followed by an etching process. In some other embodiments, the dielectric layer DI includes a photosensitive dielectric material, and the dielectric layer DI may be patterned through a photolithography process. After the de-bonding process is performed, conductive terminals 160 may be formed over the dielectric layer DI, wherein the conductive terminals 160 may be electrically connected to the seed patterns S1' and the first pillar portion 100a of the conductive pillar 100 through the openings defined in the dielectric layer DI. In some embodiments, the conductive terminals 160 may be solder balls formed by a ball placement process or other suitable metallic terminals.

In some other embodiments where the fabrication of the dielectric layer DI is omitted, the die attachment film 120, a surface of the insulating encapsulation 130, and the seed patterns S1' are exposed after performing the de-bonding process. Furthermore, the patterning process of the dielectric layer DI is also omitted, and the conductive terminals 160 may be landed on the seed patterns S1' directly.

After the conductive terminals 160 are formed, an integrated fan-out package P1 with dual sided terminals 150 and 160 are fabricated. In some embodiments, the integrated fan-out package P1 illustrated in FIG. 1G is in wafer form (i.e. a reconstructed wafer).

Figure 1H:
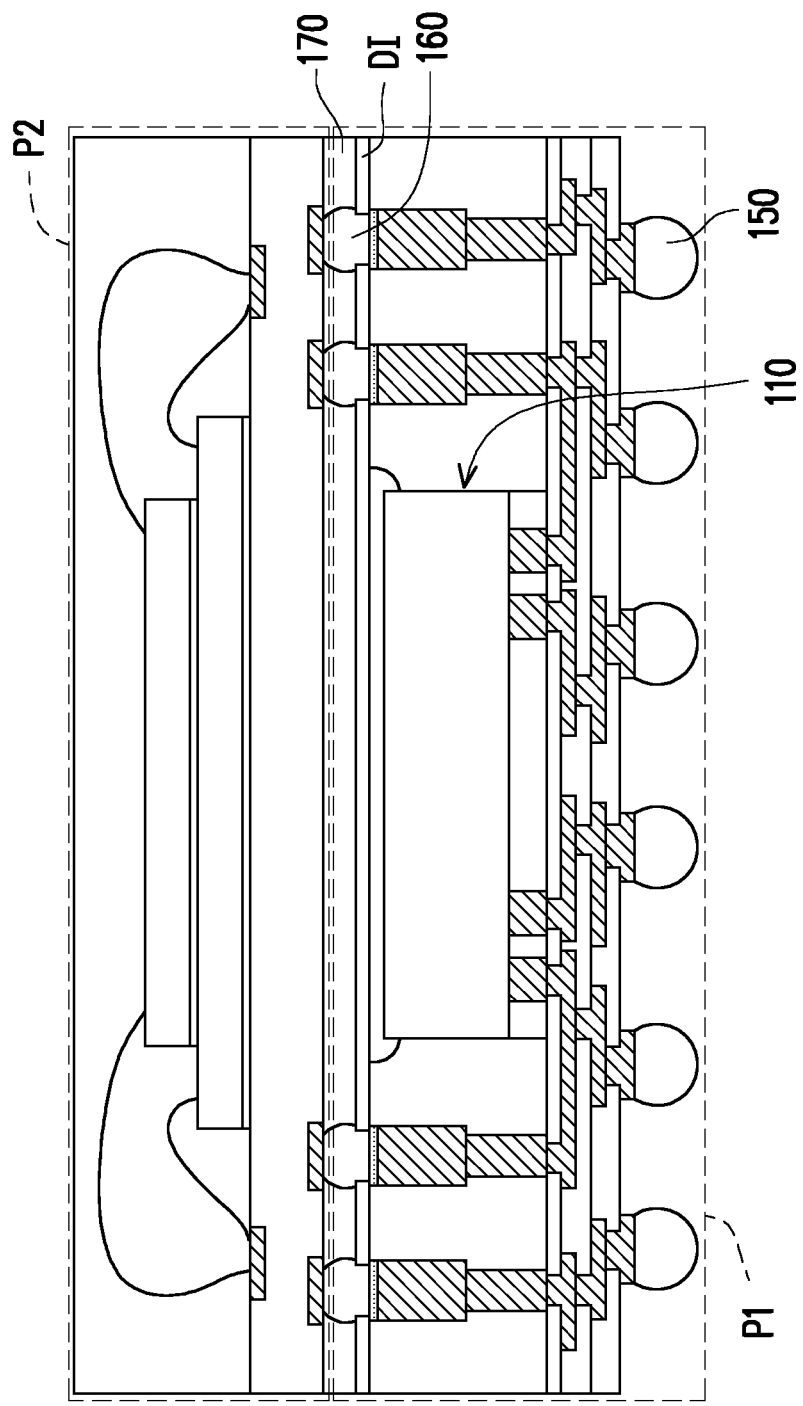

Referring to FIG. 1H, at least one package P2 is provided and placed over the integrated fan-out package P1. Then, a reflow process is performed such that the integrated fan-out package P1 and the package P2 are electrically connected to each other through the conductive terminals 160. In some embodiments where the integrated fan-out package P1 is a reconstructed wafer, one or more packages P2 may be mounted onto the integrated fan-out package P1 through a chip-to-wafer bonding process. For example, the semiconductor die 110 in the integrated fan-out package P1 is a logic die, and the package P2 is a surface mount type memory device. After the above-mentioned reflow process is performed, an underfill 170 may be formed between the integrated fan-out package P1 and the package P2 to encapsulate the conductive terminals 160. The underfill 170 enhances the reliability of electric connection between the integrated fan-out package P1 and the package P2. After the underfill 170 is formed, a package-on-package (POP) structure including the integrated fan-out package P1 and the package P2 is fabricated.

In some embodiments where the integrated fan-out package P1 is a reconstructed wafer, a wafer dicing process may be further performed to singulate the POP structure into multiple singulated POP structures.

FIG. 2A through FIG. 2H are cross-sectional views schematically illustrating a process flow for fabricating a package structure in accordance with some alternative embodiments of the present disclosure.

Referring to FIG. 2A, the processes for forming first pillar portions 100a illustrated in FIG. 2A are identical to those illustrated in FIG. 1A. The detailed descriptions are thus omitted.

Referring to FIG. 2A and FIG. 2B, after the first pillar portions 100a are formed, the first patterned photoresist layer PR1 is removed such that portions of the seed layer S1 that are not covered by the first pillar portions 100a are revealed. In some embodiments, the first patterned photoresist layer PR1 is removed through a stripping process simultaneously.

By using the first pillar portions 100a as an etch mask, the portions of the seed layer S1 that are not covered by the first pillar portions 100a may be removed through an etching process until the dielectric layer DI is revealed. After the portions of the seed layer S1 that are not covered by the first pillar portions 100a are removed, seed patterns S1' are formed between the first pillar portions 100a and the dielectric layer DI, and the seed patterns S1' are in contact with the dielectric layer DI.

In some other embodiments where the fabrication of the dielectric layer DI is omitted, by using the first pillar portions 100a as an etch mask, portions of the seed layer S1 that are not covered by the first pillar portions 100a may be removed through an etching process until the de-bonding layer DB is revealed. After the portions of the seed layer S1 that are not covered by the first pillar portions 100a are removed, seed patterns S1' are formed between the first pillar portions 100a and the de-bonding layer DB, and the seed patterns S1' are in contact with the de-bonding layer DB.

Figure 2C:
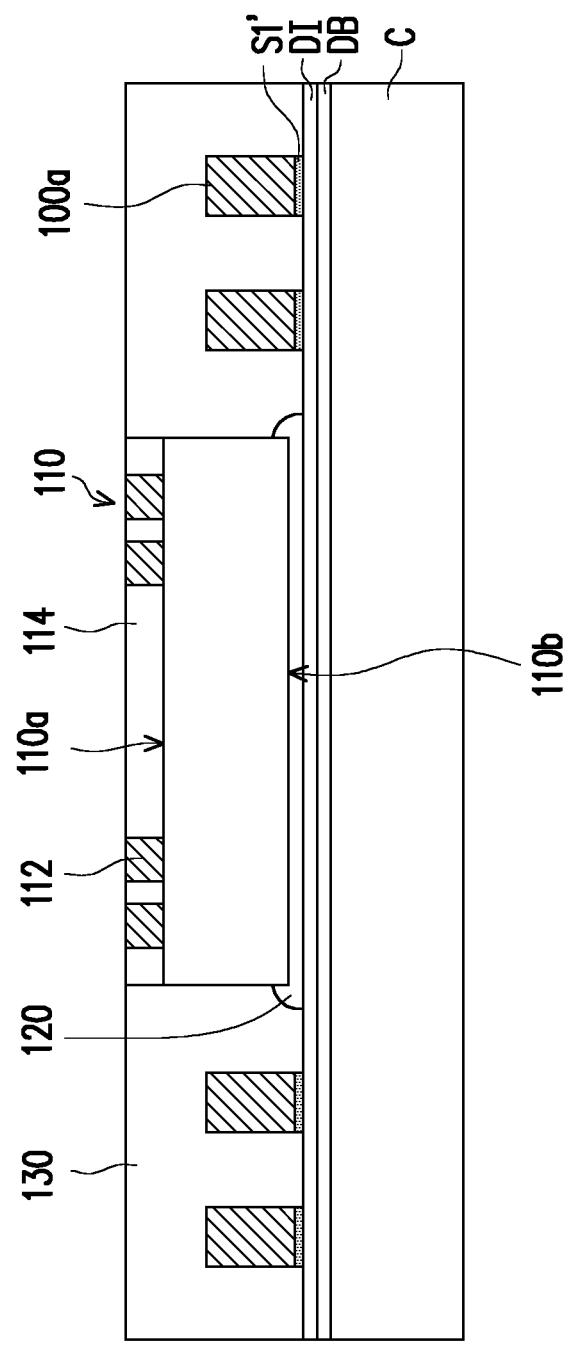

Referring to FIG. 2C, at least one semiconductor die 110 is picked-up and placed over the carrier C such that the semiconductor die 110 is mounted onto the dielectric layer DI through a die attachment film (DAF) 120, an adhesive or the like. The number of the semiconductor die 110 is not limited in the present application. In some embodiments, the semiconductor die 110 includes a back surface 110b and an active surface 110a opposite to the back surface 110b, wherein the back surface 110b of the semiconductor die 110 is adhered to the top surface of the dielectric layer DI through the die attachment film 120. The semiconductor die 110 may further include conductive vias 112 and a dielectric cap 114, wherein the conductive vias 112 protrude from the active surface 110a, and the dielectric cap 114 covers the conductive vias 112 and the active surface 110a of the semiconductor die 110. The conductive vias 112 and the active surface 110a of the semiconductor die 110 are covered and well protected by the dielectric cap 114 when the semiconductor die 110 is picked-up and placed over the carrier C.

As illustrated in FIG. 2C, the level height of the top surface of the dielectric cap 114 is higher than the level height of the top surfaces of the conductive vias 112 and the level height of the top surfaces of the second pillar portions 100a. In some embodiments, the level height of the top surface of the first pillar portion 100a is lower than the level height of the active surface 110a of the semiconductor die 110, and the level height of the top surface of the first pillar portion 100a is higher than the level height of the back surface 110b of the semiconductor die 110.

An insulating encapsulation 130 is formed over the carrier C to laterally encapsulate the semiconductor die 110, the seed patterns S1', and the first pillar portions 100a. The top surfaces of the semiconductor die 110 is accessible exposed from the insulating encapsulation 130. The top surface of the insulating encapsulation 130 may be substantially leveled with the top surfaces of the conductive vias 112 and the dielectric cap 114. Furthermore, the top surface of the insulating encapsulation 130 may be higher than the top surfaces of the first pillar portions 100a.

The insulating encapsulation 130 may be formed by an over-molding processes followed by a grinding process (e.g., a chemical mechanical polishing (CMP) process and/or a mechanical polishing process). In some embodiments, an insulating material is formed over the carrier C to cover the first pillar portions 100a, the semiconductor die 110, the seed patterns S1', and the die attachment film 120, and the insulating material is then polished through the above-mentioned grinding process until the top surfaces of the semiconductor die 110 are exposed. During the grinding process of the insulating material, a portion of the dielectric cap 114 of the semiconductor die 110 may be removed to expose the top surfaces of the conductive vias 112.

As illustrated in FIG. 2C, the width W1 of the first pillar portions 100a ranges from about 20 micrometers to about 50 micrometers, and the height H1 of the first pillar portions 100a ranges from about 50 micrometers to about 80 micrometers, for example. In some embodiments, the aspect ratio (i.e. H1/W1) of the first pillar portions 100a may range from about 2.5 to about 2.5n, and n is a positive integer greater than 1. The height H1 of the first pillar portion 100a is less than the thickness of the semiconductor die 110. Furthermore, the first pillar portions 100a may each include a vertical side surface in contact with the insulating encapsulation 130. In other words, the top width of the first pillar portion 100a may be substantially equal to the bottom width of the first pillar portion 100a.

Figure 2D:
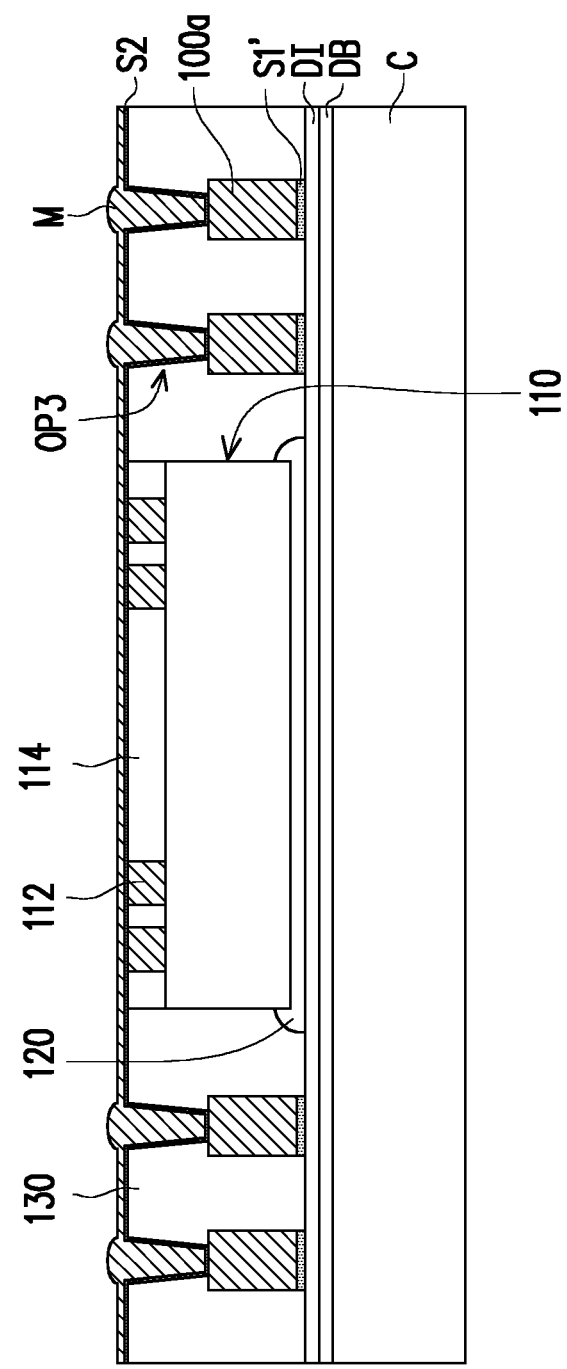

Referring to FIG. 2D, openings OP3 are formed in portions of the insulating encapsulation 130 such that portions of top surfaces of the first pillar portions 100a are exposed by the openings OP3. In some embodiments, the openings OP3 are formed in the insulating encapsulation 130 through a laser drilling process, and the width of the first pillar portions 100a may be wider than the lateral dimension of the openings OP3. In some alternative embodiments, the openings OP3 are formed in the insulating encapsulation 130 through an etching process or other suitable removal processes. For example, the first pillar portions 100a is wider than the openings OP3 defined in the insulating encapsulation 130.

After the openings OP3 are formed in the insulating encapsulation 130, a seed layer S2 may be conformally formed over the dielectric cap 104, the insulating encapsulation 130, and the top surfaces of the first pillar portions 100a exposed by the openings OP3 through a sputtering process. For example, the seed layer S2 is a sputtered Ti/Cu layer. Then, a plating process is performed to form conductive material M over the seed layer S2. The conductive material M may cover the seed layer S2 and fill the openings OP3 defined in the insulating encapsulation 130. As illustrated in FIG. 2D, since the conductive material M is formed by plating, the conductive material M may include protruding portions located above the openings OP3.

Figure 2E:
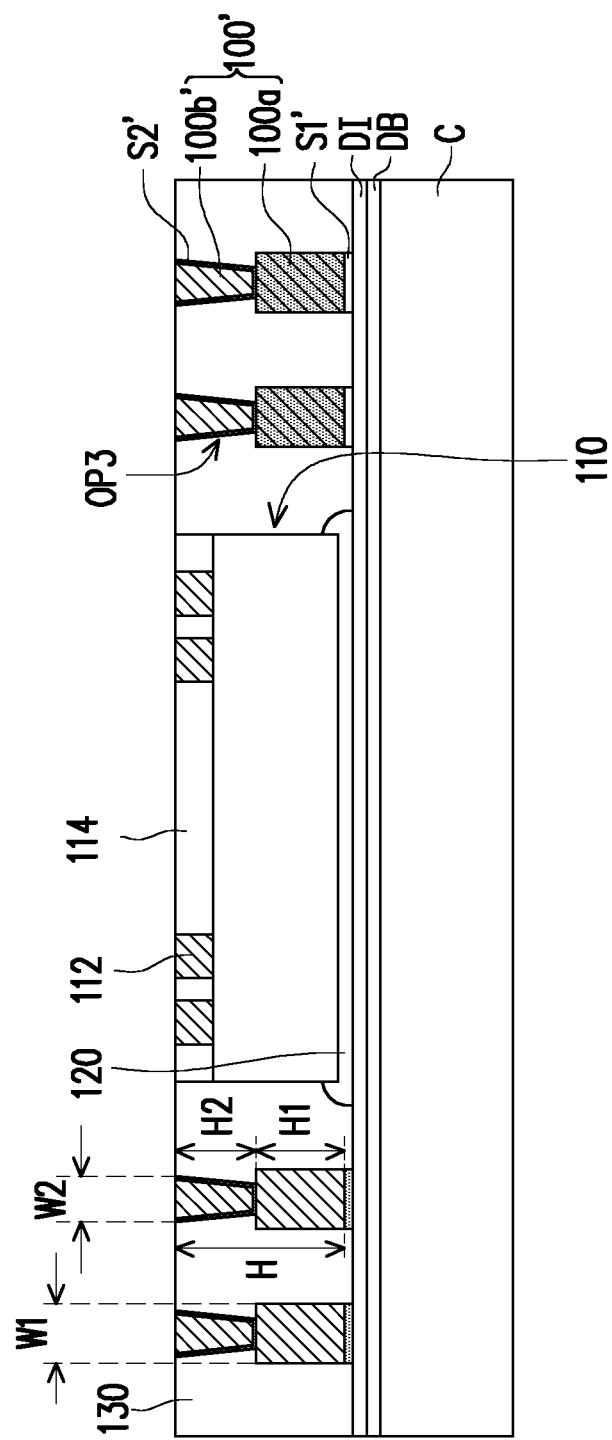

Referring to FIG. 2E, a grinding process is performed to remove the seed layer S2 and the conductive material M distributed outside the openings OP3 such that seed patterns S2' and second pillar portions 100b' are formed in the openings OP3. After the grinding process of the seed layer S2 and the conductive material M is performed, top surfaces of the second pillar portions 100b' are substantially leveled with the top surfaces of the insulating encapsulation 130, the dielectric cap 114, and the conductive vias 112. The height H1 of the first pillar portions 100a is substantially equal to the height H2 of the second pillar portions 100b', and the width W1 of the first pillar portions 100a are greater than the maximum width W2 of the second pillar portions 100b'. The aspect ratio (i.e. H2/W2) of the second pillar portions 100b' may range from about 5 to about 5n, and n is a positive integer greater than 1. For example, the width W2 of the second pillar portions 100b' ranges from about 15 micrometers to about 40 micrometers, and the height H2 of the second pillar portions 100b' ranges from about 50 micrometers to about 80 micrometers.

Figure 3A:
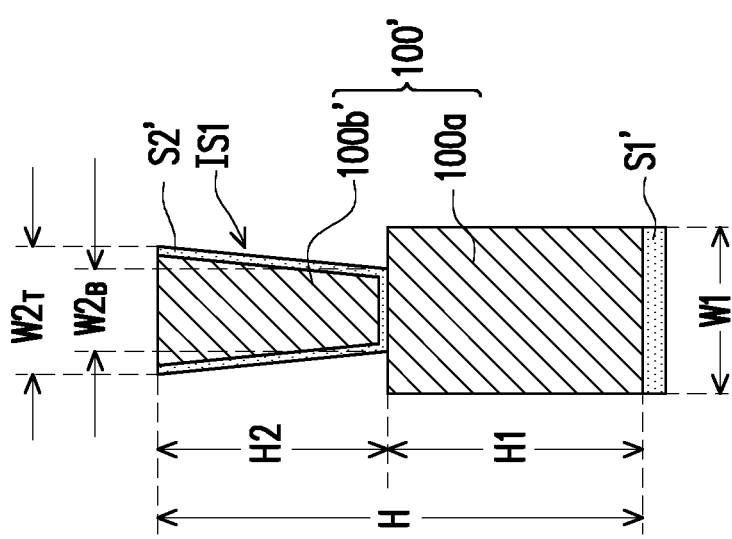
FIG. 3A through FIG. 3C are cross-sectional views schematically illustrating conductive pillars in accordance with different embodiments of the present disclosure.
Figure 3B:
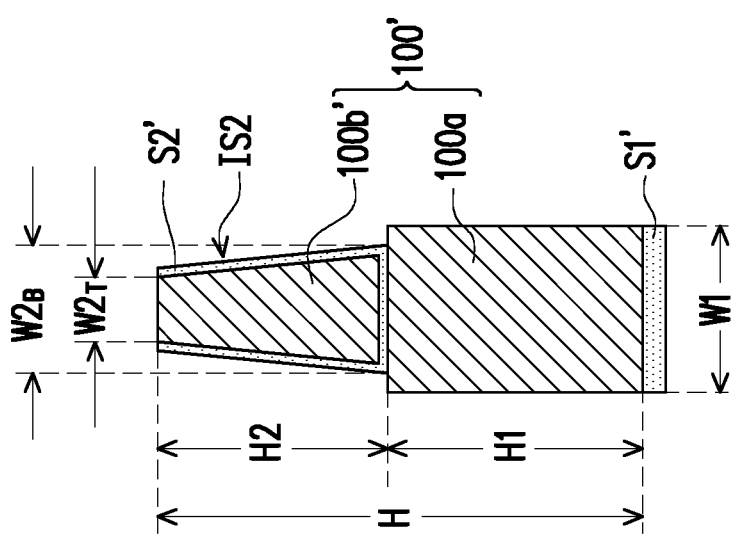
Figure 3C:
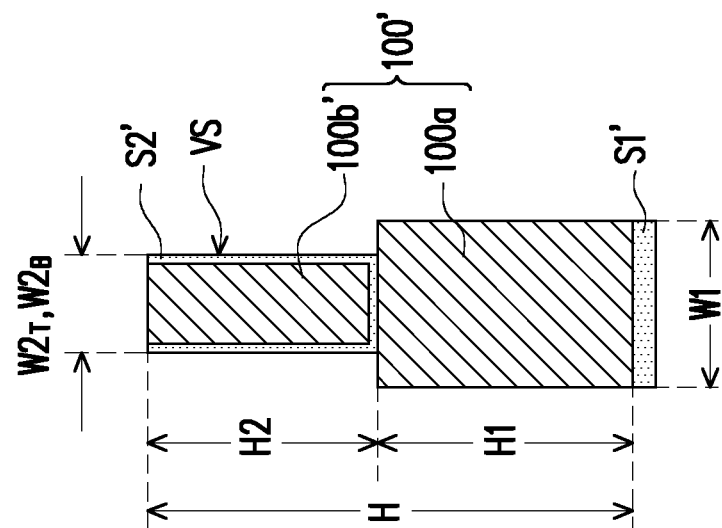

FIG. 3A through FIG. 3C are cross-sectional views schematically illustrating conductive pillars in accordance with different embodiments of the present disclosure. In some embodiments, as illustrated in FIG. 3A, the second pillar portions 100b' each includes an inclined side surface IS1 in contact with the insulating encapsulation 130, wherein the top width $W2_T$ of the second pillar portion 100b' may be greater than the bottom width $W2_B$ of the second pillar portion 100b'. The aspect ratio (i.e. $H2/W2_B$) of the second pillar portions 100b' may range from about 8 to about 8n, and n is a positive integer greater than 1. For example, the top width $W2_T$ of the second pillar portions 100b' ranges from about 15 micrometers to about 45 micrometers, the bottom width $W2_B$ of the second pillar portions 100b' ranges from about 10 micrometers to about 45 micrometers, and the height H2 of the second pillar portions 100b' ranges from about 50 micrometers to about 80 micrometers.

In some other embodiments, as illustrated in FIG. 3B, the second pillar portions 100b' each includes an inclined side surface IS2 in contact with the insulating encapsulation 130, wherein the top width $W2_T$ of the second pillar portion 100b' may be less than the bottom width $W2_B$ of the second pillar portion 100b'. The aspect ratio (i.e. $H2/W2_T$) of the second pillar portions 100b' may range from about 8 to about 8n, and n is a positive integer greater than 1. For example, the top width $W2_T$ of the second pillar portions 100b' ranges from about 10 micrometers to about 45 micrometers, the bottom width $W2_B$ of the second pillar portions 100b' ranges from about 15 micrometers to about 50 micrometers, and the height H2 of the second pillar portions 100b' ranges from about 50 micrometers to about 80 micrometers.

In still other embodiments, as illustrated in FIG. 3C, the second pillar portions 100b' each includes a vertical side surface VS in contact with the insulating encapsulation 130, wherein the top width $W2_T$ of the second pillar portion 100b' may be substantially equal to the bottom width $W2_B$ of the second pillar portion 100b'. The aspect ratio (i.e. $H2/W2_B$) of the second pillar portions 100b' may range from about 8 to about 8n, and n is a positive integer greater than 1. For example, the top width $W2_T$ and the bottom width $W2_B$ of the second pillar portions 100b' ranges from about 10 micrometers to about 50 micrometers, and the height H2 of the second pillar portions 100b' ranges from about 50 micrometers to about 80 micrometers.

Figure 2F:
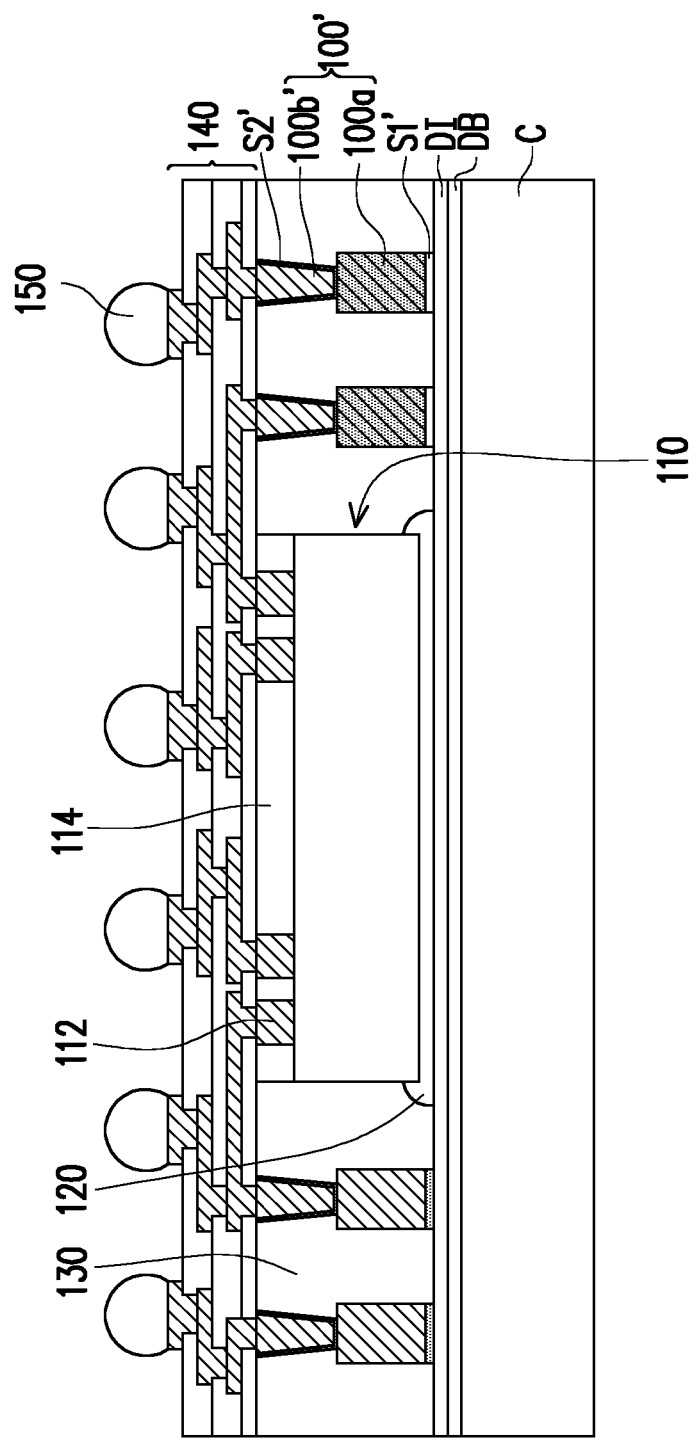
Figure 2G:
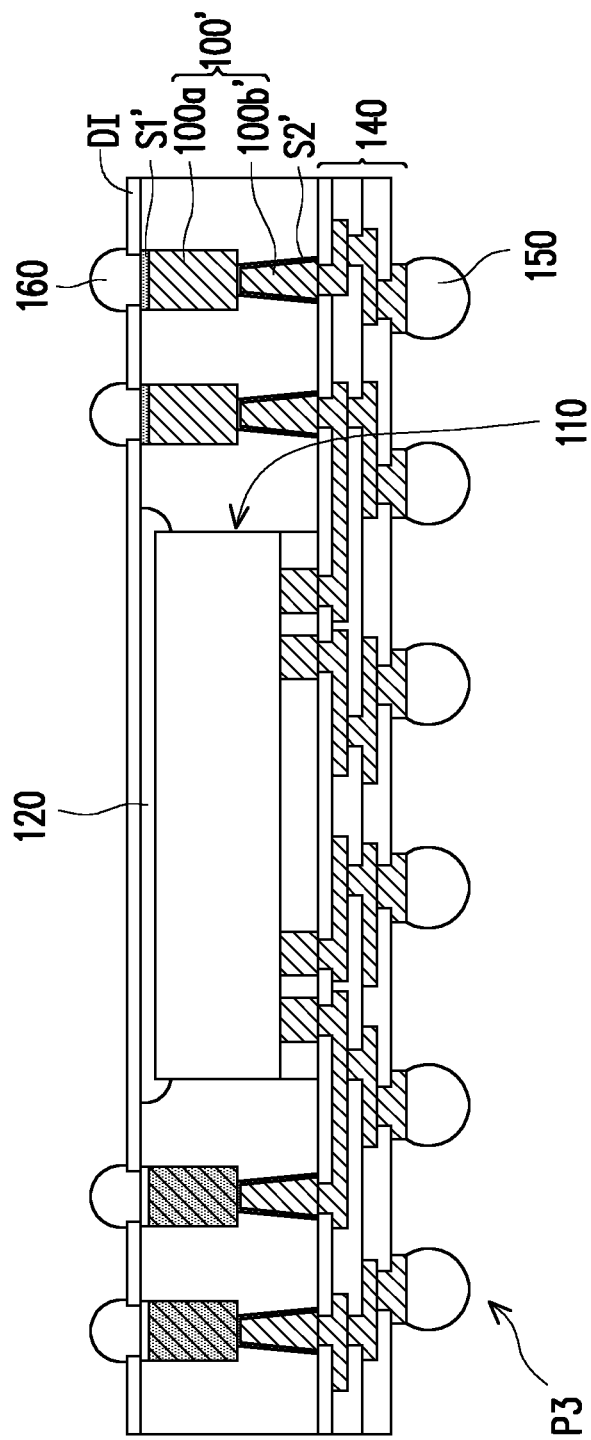
Figure 2H:
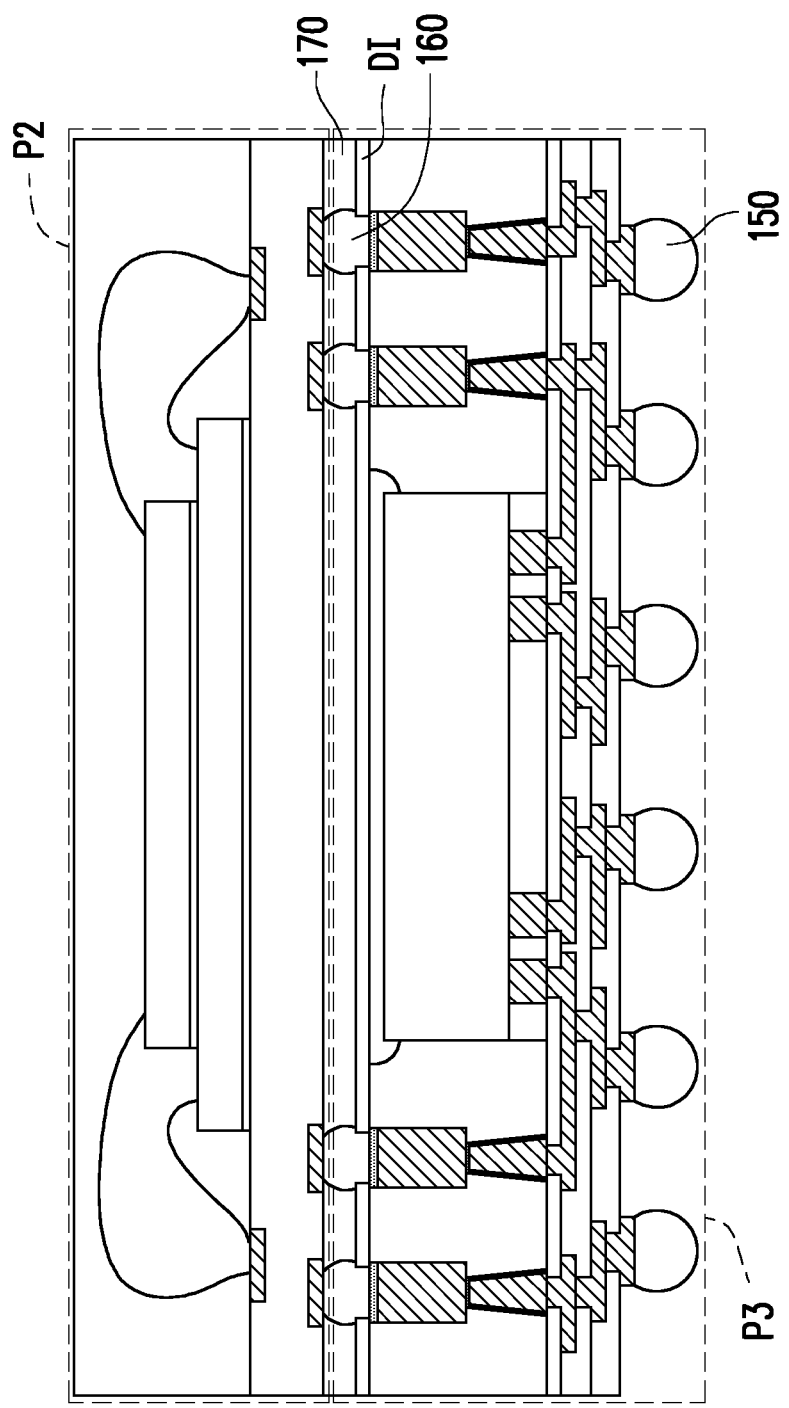

Referring to FIG. 2F through FIG. 2H, after the conductive terminals 160 are formed, a POP structure including an integrated fan-out package P3 and a package P2 are fabricated. The processes illustrated in FIG. 2F through FIG. 2H are identical to those illustrated in FIG. 1F through FIG. 1H. The detailed descriptions are thus omitted.

Since the conductive pillars 100' are formed through a multiple-step plating process, the conductive pillars 100' with high aspect ratio (e.g., aspect ratio higher than 5) may be fabricated easily. Accordingly, the fabrication yield rate of the conductive pillars 100' may increase.

In accordance with some embodiments of the disclosure, a structure including a semiconductor die, a conductive pillar, and an insulating encapsulation is provided. The conductive pillar includes a first pillar portion and a second pillar portion disposed on the first pillar portion, wherein a first width of the first pillar portion is greater than a second width of the second pillar portion. The insulating encapsulation laterally encapsulates the semiconductor die and the conductive pillar. In some embodiments, a first aspect ratio of the first pillar portion is less than a second aspect ratio of the second pillar portion. In some embodiments, a first height of the first pillar portion is substantially equal to a second height of the second pillar portion, and a first width of the first pillar portion is greater than to a second width of the second pillar portion. In some embodiments, the second pillar portion includes an inclined side surface in contact with the insulating encapsulation, and a top width of the second pillar is greater than a bottom width of the second pillar. In some embodiments, the second pillar portion includes an inclined side surface in contact with the insulating encapsulation, and a top width of the second pillar is less than a bottom width of the second pillar. In some embodiments, the second pillar portion includes a vertical side surface in contact with the insulating encapsulation, and a top width of the second pillar is substantially equal to a bottom width of the second pillar. In some embodiments, a ratio of a height of the conductive pillar to a bottom width of the conductive pillar ranges from about 5 to about 5n, and n is a positive integer greater than 1. In some embodiments, the semiconductor die includes conductive vias protruding from an active surface of the semiconductor die, and a height of the first pillar portion is less than a thickness of the semiconductor die.

In accordance with some embodiments of the disclosure, a method including the following steps is provided. A conductive pillar is formed over a carrier through a multi-step plating process, wherein the conductive pillar includes a first pillar portion and a second pillar portion disposed on the first pillar portion, and a first width of the first pillar portion is greater than a second width of the second pillar portion. A semiconductor die is placed over the carrier. The conductive pillar and the semiconductor die are encapsulated with an insulating encapsulation. In some embodiments, the multi-step plating process includes: forming a seed layer over the carrier; forming a first patterned photoresist layer over the seed layer, wherein the first patterned photoresist layer includes a first opening, and the seed layer is partially exposed by the first opening; plating the first pillar portion on an exposed portion of the seed layer exposed by the first opening; forming a second patterned photoresist layer over the first patterned photoresist layer, wherein the second patterned photoresist layer includes a second opening, and the second opening is aligned with the first pillar portion; plating the second pillar portion on an exposed portion of the first pillar portion exposed by the second opening; removing the first patterned photoresist layer and the second patterned photoresist layer; and removing the seed layer uncovered by the first pillar portion.

In some embodiments, the first opening is wider than the second opening. In some embodiments, the first patterned photoresist layer and the second patterned photoresist layer are substantially identical in thickness. In some embodiments, the method further includes: forming a redistribution circuit layer over the semiconductor die and the insulating encapsulation, wherein the semiconductor die is electrically connected to the conductive pillar though the redistribution circuit layer.

In accordance with some embodiments of the disclosure, a method including the following steps is provided. A first pillar portion of a conductive pillar is formed over a carrier. A semiconductor die is placed over the carrier. The first pillar portion and the semiconductor die are encapsulated with an insulating encapsulation. An opening is formed in the insulating encapsulation to expose a portion of the first pillar portion. A second pillar portion is formed in the opening defined in the insulating encapsulation, wherein a first width of the first pillar portion is greater than a second width of the second pillar portion. In some embodiments, the first pillar portion is formed through a plating process. In some embodiments, forming the first pillar portion includes: forming a seed layer over the carrier; forming a first patterned photoresist layer over the seed layer, the first patterned photoresist layer including an opening, and the seed layer being partially exposed by the opening; plating the first pillar portion on an exposed portion of the seed layer exposed by the opening; removing the first patterned photoresist layer; and removing the seed layer uncovered by the first pillar portion. In some embodiments, the seed layer uncovered by the first pillar portion is removed prior art to encapsulating the first pillar portion and the semiconductor die with the insulating encapsulation. In some embodiments, the first pillar portion is wider than the opening defined in the insulating encapsulation. In some embodiments, the opening defined in the insulating encapsulation is formed through a laser drilling process. In some embodiments, forming the second pillar portion includes: forming a seed layer over the insulating encapsulation and a surface of the first pillar portion exposed by the opening defined in the insulating encapsulation; forming a conductive material over the seed layer; and polishing the conductive material and the seed layer until the insulating encapsulation is exposed to form the second pillar portion in the opening defined in the insulating encapsulation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first pillar portion of a conductive pillar over a carrier;
   placing a semiconductor die over the carrier;

encapsulating the first pillar portion and the semiconductor die with an insulating encapsulation;

forming a first opening in the insulating encapsulation to expose a portion of the first pillar portion; and forming a second pillar portion of the conductive pillar in the first opening defined in the insulating encapsulation, wherein a ratio of a height of the conductive pillar to a bottom width of the conductive pillar ranges from about 5 to about 5n, n is a positive integer greater than 1, and forming the second pillar portion comprises:

forming a first seed layer over the insulating encapsulation and a surface of the first pillar portion exposed by the first opening defined in the insulating encapsulation;

forming a conductive material over the first seed layer; and polishing the conductive material and the first seed layer until the insulating encapsulation is exposed to form the second pillar portion in the first opening defined in the insulating encapsulation.

2. The method as claimed in claim 1, wherein a first aspect ratio of the first pillar portion is less than a second aspect ratio of the second pillar portion, wherein a first width of the first pillar portion is greater than a second width of the second pillar portion, and a first height of the first pillar portion is substantially equal to a second height of the second pillar portion.

3. The method as claimed in claim 2, wherein forming the first pillar portion comprises:

forming a second seed layer over the carrier;

forming a first patterned photoresist layer over the second seed layer, the first patterned photoresist layer comprising a second opening, and the second seed layer being partially exposed by the second opening;

plating the first pillar portion on an exposed portion of the second seed layer exposed by the second opening;

removing the first patterned photoresist layer; and removing the second seed layer uncovered by the first pillar portion.

4. The method as claimed in claim 3, wherein the second seed layer uncovered by the first pillar portion is removed prior art to encapsulating the first pillar portion and the semiconductor die with the insulating encapsulation.

5. The method as claimed in claim 1, wherein a first aspect ratio of the first pillar portion ranges from about 2.5 to about 2.5n, and n is a positive integer greater than 1.

6. The method as claimed in claim 1, wherein a second aspect ratio of the second pillar portion ranges from about 7 to about 7n, and n is a positive integer greater than 1.

7. The method as claimed in claim 1, wherein a level height of a contact interface between the first pillar portion and the second pillar portion is between a level height of an active surface of the semiconductor die and a level height of a back surface of the semiconductor die.

8. The method as claimed in claim 1, wherein a first width of the first pillar portion is greater than a second width of the second pillar portion.

9. The method as claimed in claim 1 further comprising:

removing the carrier from the semiconductor die and the first pillar portion encapsulated by the insulating encapsulation.

10. The method as claimed in claim 1 further comprising:

forming a redistribution circuit layer over the semiconductor die and the insulating encapsulation, wherein the semiconductor die is electrically connected to the conductive pillar though the redistribution circuit layer.

11. A method, comprising:

laterally encapsulating a first pillar portion and a semiconductor die with an insulating encapsulation;

forming an opening in the insulating encapsulation, and a top surface of the first pillar portion being revealed by the opening;

forming a conductive material covering the insulating encapsulation and filling the opening; and partially removing the conductive material until the insulating encapsulation is exposed and a second pillar portion is formed in the opening, wherein a ratio of a total height of the first pillar portion and the second pillar portion to a bottom width of the first pillar portion ranges from about 5 to about 5n, and n is a positive integer greater than 1.

12. The method as claimed in claim 11, wherein a level height of a contact interface between the first pillar portion and the second pillar portion is between a level height of an active surface of the semiconductor die and a level height of a back surface of the semiconductor die.

13. The method as claimed in claim 11, wherein a first aspect ratio of the first pillar portion ranges from about 2.5 to about 2.5n, and n is a positive integer greater than 1.

14. The method as claimed in claim 11, wherein a second aspect ratio of the second pillar portion ranges from about 7 to about 7n, and n is a positive integer greater than 1.

15. The method as claimed in claim 11 further comprising:

forming a redistribution circuit layer over the semiconductor die and the insulating encapsulation, wherein the semiconductor die is electrically connected to the conductive pillar though the redistribution circuit layer.

16. A method, comprising:

laterally encapsulating a first pillar portion and a semiconductor die with an insulating encapsulation;

partially removing the insulating encapsulation to reveal a portion of a top surface of e first pillar portion;

forming conductive material covering the insulating encapsulation and the portion of the top surface of the first pillar portion; and grinding the conductive material until the insulating encapsulation is exposed to form a second pillar portion disposed on the portion of the top surface of the first pillar portion, wherein a ratio of a total height of the first pillar portion and the second pillar portion to a bottom width of the first pillar portion ranges from about 5 to about 5n, and n is a positive integer greater than 1.

17. The method as claimed in claim 16, wherein a first width of the first pillar portion is greater than a second width of the second pillar portion.

18. The method as claimed in claim 16, wherein a first aspect ratio of the first pillar portion ranges from about 2.5 to about 2.5n, and n is a positive integer greater than 1.

19. The method as claimed in claim 16, wherein a second aspect ratio of the second pillar portion ranges from about 7 to about 7n, and n is a positive integer greater than 1.

20. The method as claimed in claim 16, wherein a level height of a contact interface between the first pillar portion and the second pillar portion is between a level height of an active surface of the semiconductor die and a level height of a back surface of the semiconductor die.

* * * * *